(12) United States Patent
Arai

(10) Patent No.: US 8,426,862 B2
(45) Date of Patent: *Apr. 23, 2013

(54) THIN FILM TRANSISTOR SUBSTRATE AND DISPLAY DEVICE

(75) Inventor: Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/550,995

(22) Filed: Jul. 17, 2012

(65) Prior Publication Data

US 2012/0280241 A1 Nov. 8, 2012

Related U.S. Application Data

(63) Continuation of application No. 12/607,190, filed on Oct. 28, 2009, now Pat. No. 8,237,162.

(30) Foreign Application Priority Data

Nov. 5, 2008 (JP) .................................. 2008-284621

(51) Int. Cl.
*H01L 29/04* (2006.01)
(52) U.S. Cl.
USPC .............................................. 257/59; 257/613
(58) Field of Classification Search .................... 257/59, 257/72, 350, 613, 43
See application file for complete search history.

(56) References Cited

U.S. PATENT DOCUMENTS 8,237,162 B2 * 8/2012 Arai ................................. 257/59
2008/0119018 A1 5/2008 Toyota et al.

FOREIGN PATENT DOCUMENTS

| JP | 2006-207094 | | 8/2006 |
| JP | 2008-129314 | A | 6/2008 |
| JP | 2008-134625 | A | 6/2008 |
| JP | 2008-233123 | A | 10/2008 |

* cited by examiner

*Primary Examiner* — Mark Prenty
(74) *Attorney, Agent, or Firm* — SNR Denton US LLP

(57) ABSTRACT

A thin film transistor substrate with reduced interlayer short-circuit defects in a capacitor, and a display device having the thin film transistor substrate. The thin film transistor substrate includes: a substrate; a thin film transistor having, over the substrate, a gate electrode, a gate insulating film, an oxide semiconductor layer, and a source-drain electrode in order; and a capacitor having, over the substrate, a bottom electrode, a capacitor insulating film, and a top electrode made of oxide semiconductor in order.

6 Claims, 17 Drawing Sheets

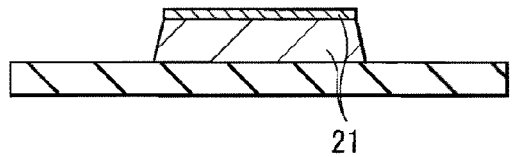
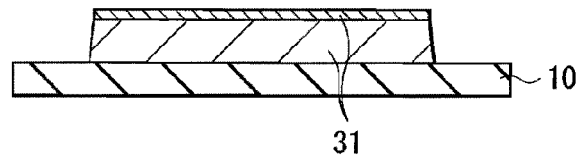
FIG. 11A  FIG. 11B
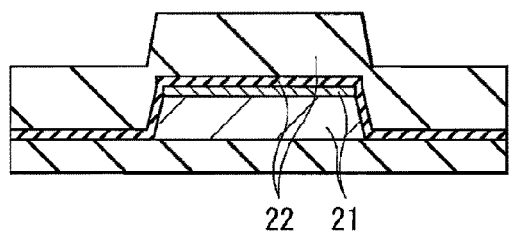
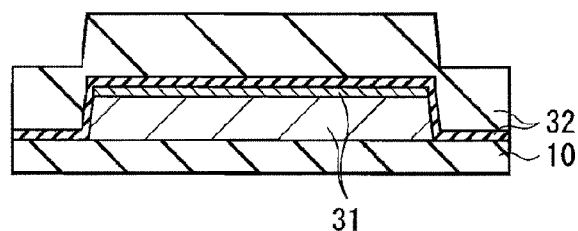
FIG. 12A  FIG. 12B
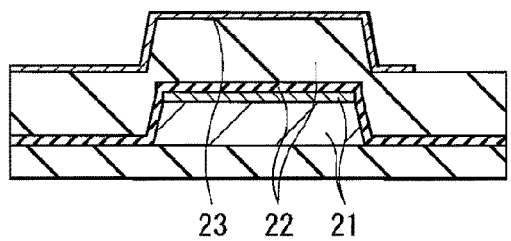
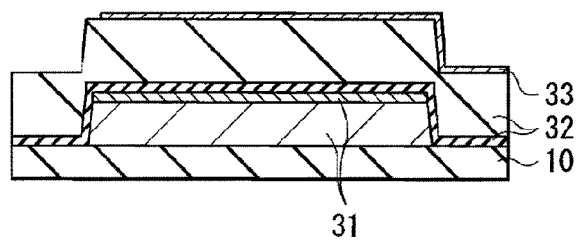
FIG. 13A  FIG. 13B
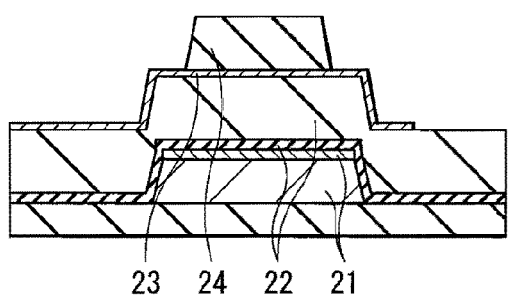
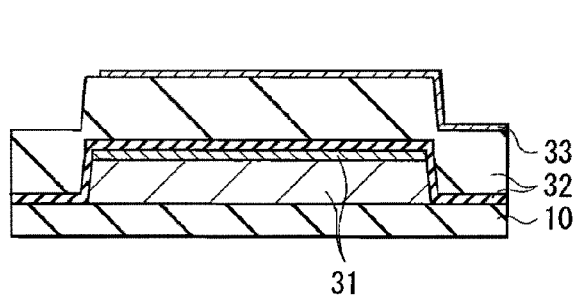
FIG. 14A  FIG. 14B

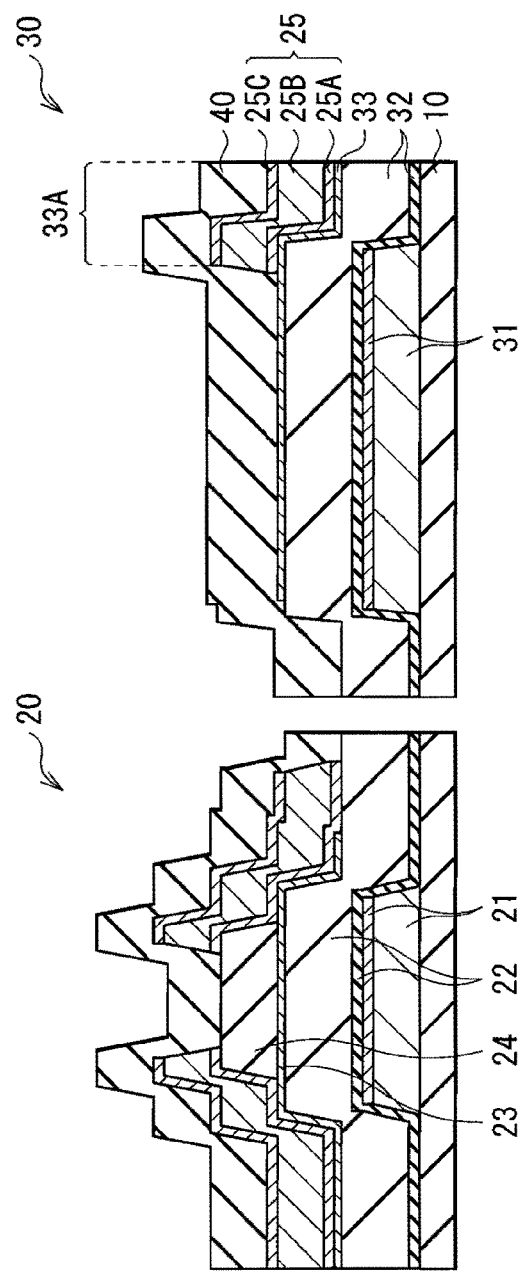

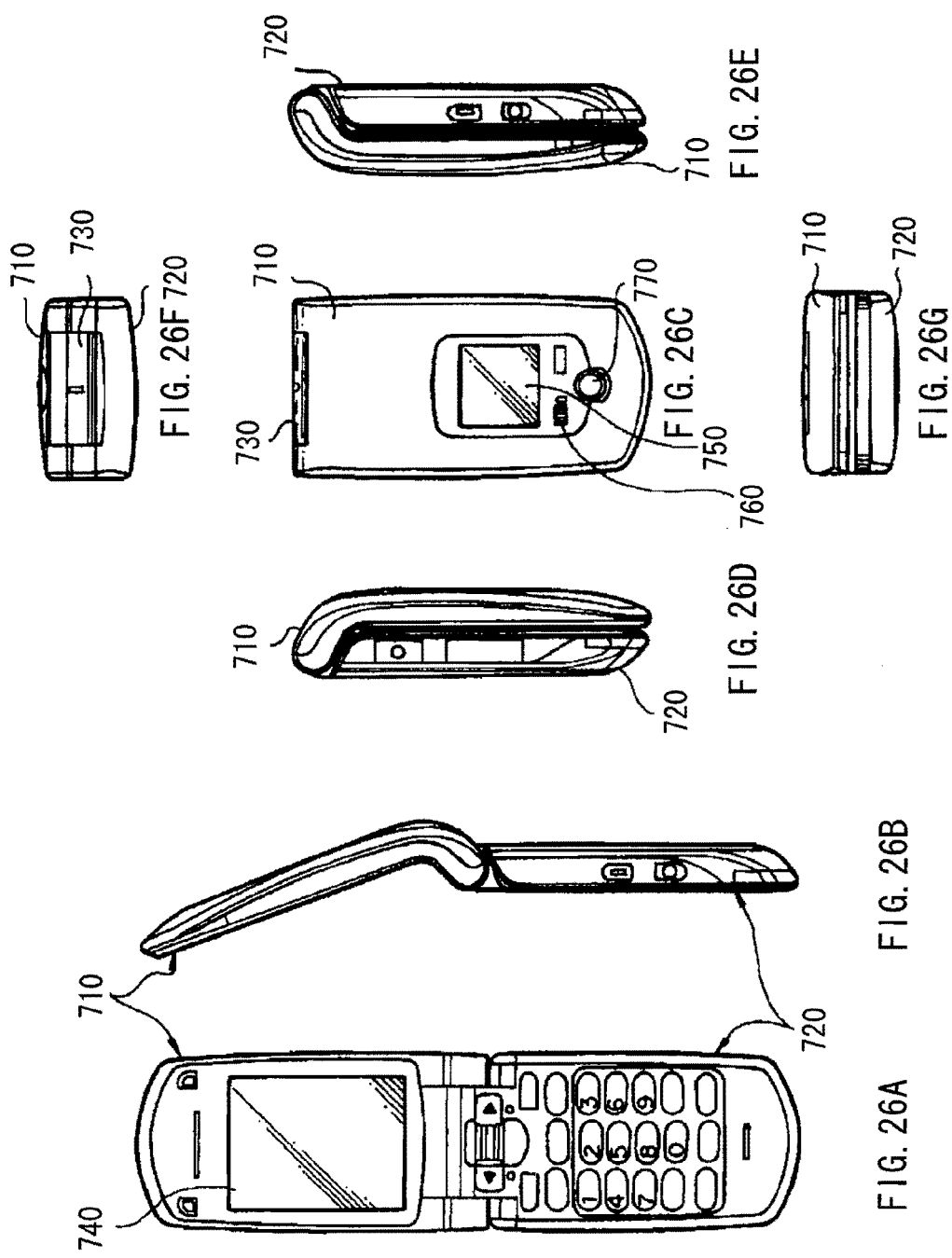

THIN FILM TRANSISTOR SUBSTRATE AND DISPLAY DEVICE

RELATED APPLICATION DATA

This application is a continuation of U.S. patent application Ser. No. 12/607,190, filed Oct. 28, 2009, now U.S. Pat. No. 8,237,162, the entirety of which is incorporated herein by reference to the extent permitted by law. The present application claims the benefit of priority to Japanese Patent Application No. JP 2008-284621 filed in the Japan Patent Office on Nov. 5, 2008, the entirety of which is incorporated by reference herein to the extent permitted by law.

BACKGROUND OF THE INVENTION

1. Field of the Invention

The present invention relates to a thin film transistor substrate in which a thin film transistor (TFT) and a capacitor are formed on a substrate and a display device having the same.

2. Description of the Related Art

At present, flat-panel-type display devices which are becoming the mainstream of display devices include a liquid crystal display device, a plasma display device, and an organic EL (electro luminescence) display device. Some of them use a thin film transistor substrate (hereinbelow, also called "TFT substrate") in which drive circuits including a TFT are formed on a substrate. The TFT substrate is obtained by forming a wiring layer and a semiconductor layer on a substrate mainly made of a glass plate, by using sputtering or CVD (Chemical Vapor Deposition) and patterning the layers with the use of photolithography to form a pattern of TFT circuits and wires.

SUMMARY OF THE INVENTION

In a process of manufacturing a TFT substrate, due to a foreign matter called dust, lack in a pattern or excessive residual may occur. Such lack in a pattern (open defect) or excessive residual (short-circuit defect) is generally called defects which cause disconnection in a circuit or short-circuit. In particular, in a TFT substrate for an organic EL display device, a complicated compensation circuit has to be formed in each pixel so that uniform current may be passed to each pixel. A big issue arises such that, due to the complicated compensation circuit, defects increase and the yield drops. One of such defects is an interlayer short-circuit defect in a capacitor. The interlayer short-circuit defect is that a top electrode and a bottom electrode are short-circuited due to a foreign matter existing in an insulating film of a capacitor.

In related art, a method of making a top electrode in a capacitor of amorphous silicon (a-Si) and forming it in a comb teeth shape is proposed (refer to, for example, Japanese Unexamined Patent Application Publication No. 2006-207094). Normally, even if the top electrode is made of amorphous silicon, the conductivity is low, and the function of a capacitor may not be obtained. However, in Japanese Unexamined Patent Application Publication No. 2006-207094, a comb-teeth-shaped electrode having a small opening area is provided over an amorphous silicon layer and a gate voltage is properly controlled, thereby changing an effective capacitor area and using the structure as a variable capacitor.

It is therefore desirable to provide a thin film transistor substrate in which an interlayer short-circuit defect in a capacitor may be reduced, and a display device having the same.

A thin film transistor substrate according to an embodiment of the present invention includes the following elements (A) to (C); (A) a substrate; (B) a thin film transistor having, over the substrate, a gate electrode, a gate insulating film, an oxide semiconductor layer, and a source-drain electrode in order; and (C) a capacitor having, over the substrate, a bottom electrode, a capacitor insulating film, and a top electrode made of oxide semiconductor in order.

A display device according to an embodiment of the present invention includes a display element in a thin film transistor substrate. The thin film transistor substrate is the above-described thin film transistor substrate according to an embodiment of the invention.

In the thin film transistor substrate as an embodiment of the invention, the top electrode in the capacitor is made of oxide semiconductor, so that even if a foreign matter exists in an insulating film in the capacitor, occurrence of an interlayer short-circuit defect is suppressed. The oxide semiconductor may have conductivity higher than that of amorphous silicon, so that the sufficient function of the top electrode in the capacitor may be obtained. Therefore, by constructing the display device by using the thin film transistor substrate according to an embodiment of the present invention, various display abnormalities caused by the interlayer short-circuit defect may be reduced.

In the thin film transistor substrate according to an embodiment of the invention, the top electrode in the capacitor is made of oxide semiconductor, so that even if a foreign matter exists in an insulating film in the capacitor, occurrence of an interlayer short-circuit defect is suppressed. Therefore, the display device according to an embodiment of the present invention constructed by using the thin film transistor substrate according to an embodiment of the present invention may reduce various display abnormalities caused by the interlayer short-circuit defect in the capacitor, and realize high display quality.

Other and further objects, features and advantages of the invention will appear more fully from the following description.

BRIEF DESCRIPTION OF THE DRAWINGS

FIGS. 11A and 11B are cross sections illustrating a method of manufacturing the display device shown in FIG. 1 in process order.

FIGS. 12A and 12B are cross sections illustrating a process subsequent to FIGS. 11A and 11B.

FIGS. 13A and 13B are cross sections illustrating a process subsequent to FIGS. 12A and 12B.

FIGS. 14A and 14B are cross sections illustrating a process subsequent to FIGS. 13A and 13B.

FIGS. 16A and 16B are cross sections illustrating a process subsequent to FIGS. 15A and 15B.

FIG. 26A is a front view illustrating a state where a display device of application example 5 is open, FIG. 26B is a side view of the display device, FIG. 26C is a front view illustrating a state where the display device is closed, FIG. 26D is a left side view, FIG. 26E is a right side view, FIG. 26F is a top view, and FIG. 26G is a bottom view.

DETAILED DESCRIPTION OF THE PREFERRED EMBODIMENTS

Embodiments of the present invention will be described in detail hereinbelow with reference to the drawings. The description will be given in the following order.
1. First embodiment (an example of constantly making a potential applied to a capacitor a positive potential)
2. Modification (an example of performing hydrogen treatment on a capacitor before formation of a passivation film)
3. Second embodiment (an example of forming an opening in a passivation film and performing hydrogen treatment on a capacitor)

First Embodiment

Figure 1:
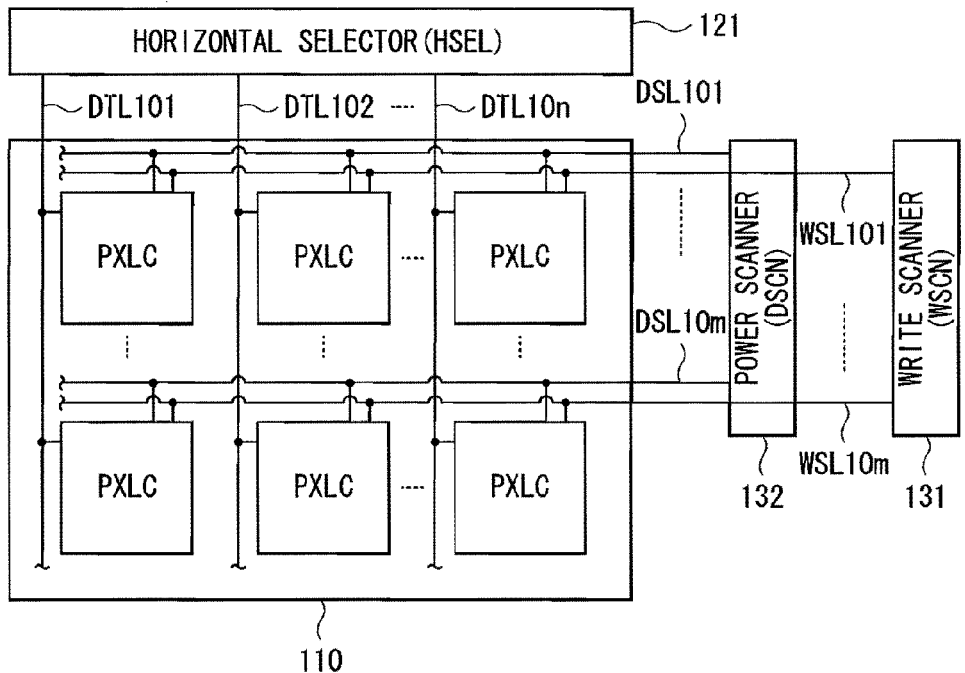
FIG. 1 is a diagram illustrating a configuration of a display device according to a first embodiment of the present invention.

FIG. 1 illustrates a configuration of a display device according to a first embodiment of the present invention. The display device is used as a very-thin organic light-emission color display device or the like. For example, in a TFT substrate 1, a display region 110 in which pixels PXLC are disposed in a matrix of m rows×n columns is formed. Around the display region 110, a horizontal selector (HSEL) 121 as a signal unit (signal selector) is formed as a drive unit and a write scanner (WSCN) 131 and a power scanner (DSCN) 132 as scanner units are formed.

In the display region 110, signal lines DTL101 to DTL10$n$ are disposed in the column direction, and scan line WSL101 to WSL10$m$ and power source lines DSL101 to DSL10$m$ are disposed in the row direction. In a part where the signal line DTL and the scan line WSL cross each other, a pixel PXLC, that is, a pixel circuit 140 is provided. The signal lines DTL are connected to the horizontal selector 121, and a video signal is supplied from the horizontal selector 121 to the signal lines DTL. The scan lines WSL are connected to the write scanner 131. The power source lines DSL are connected to the power scanner 132.

Figure 2:
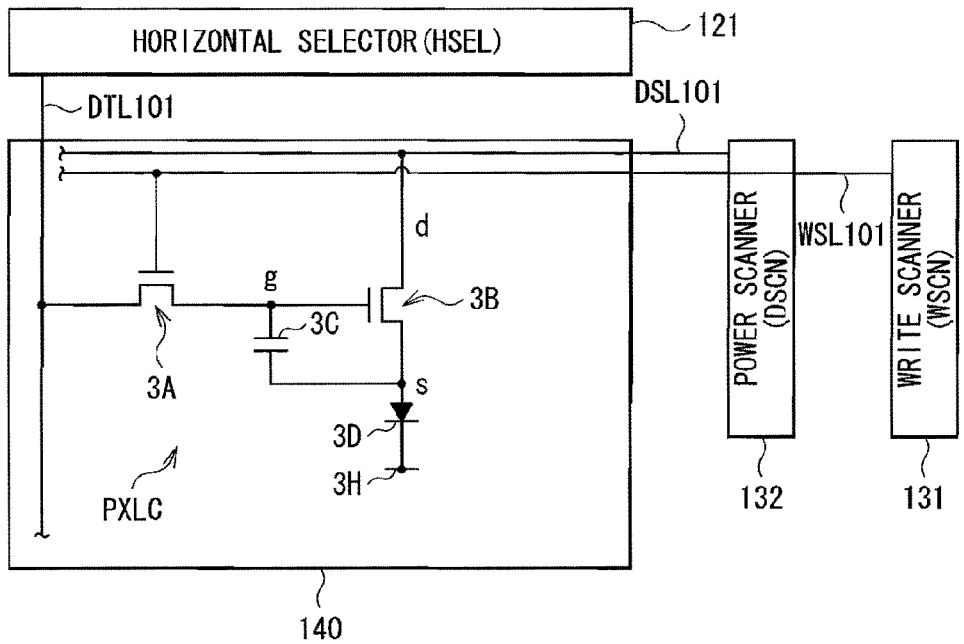
FIG. 2 is an equivalent circuit diagram illustrating an example of a pixel drive circuit shown in FIG. 1.

FIG. 2 illustrates an example of the pixel circuit 140. The pixel circuit 140 is an active-type drive circuit having a sampling transistor 3A, a drive transistor 3B, a storage capacitor 3C, and a light emitting element 3D made by any one of organic light emitting elements 10R, 10G, and 10B as a display element. The gate of the sampling transistor 3A is connected to a corresponding scan line WSL101, one of the source and drain of the sampling transistor 3A is connected to the corresponding signal line DTL101, and the other one of the source and drain is connected to a gate "g" of the drive transistor 3B. A drain "d" of the drive transistor 3B is connected to the corresponding power source line DSL101, and a source "s" is connected to the anode of the light emitting element 3D. The cathode of the light emitting element 3D is connected to a grounding line 3H. The grounding line 3H is disposed common to all of pixels PXLC. The storage capacitor 3C is connected between the source "s" and the gate "g" of the drive transistor 3B.

The sampling transistor 3A is conducted in accordance with a control signal supplied from the scan line WSL101, samples the potential of a video signal supplied from the signal line DTL101, and retains it in the storage capacitor 3C. The drive transistor 3B receives current supplied from the power source line DSL101 and supplies drive current to the light emitting element 3D in accordance with the signal potential retained in the storage capacitor 3C. The light emitting element 3D emits light with brightness according to the signal potential of the video signal by the supplied drive current.

Figure 3:
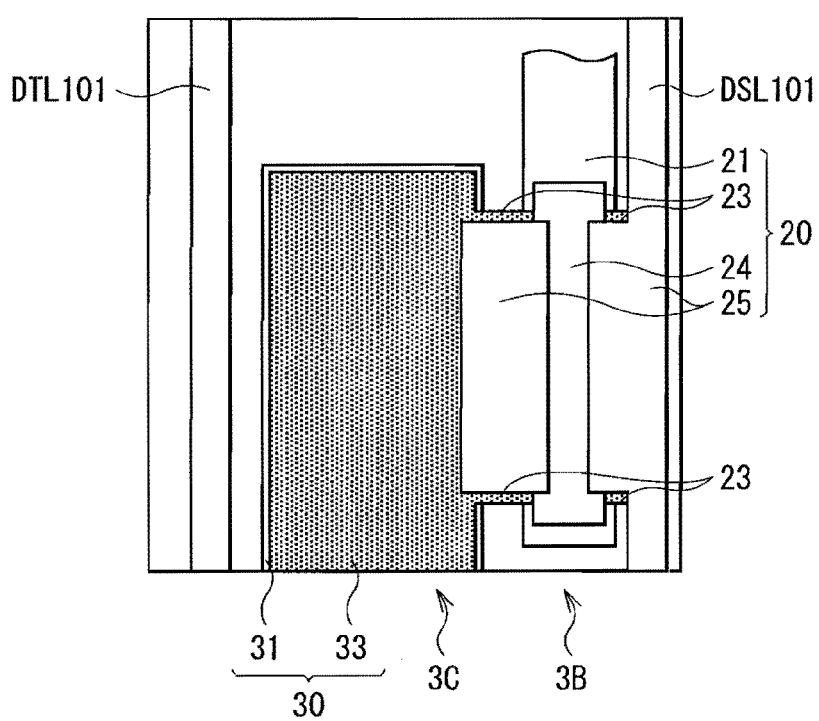
FIG. 3 is a plan view illustrating a configuration of a part of the pixel drive circuit of a TFT substrate shown in FIG. 2.

FIG. 3 shows a plane configuration of a part of the pixel circuit 140 in the TFT substrate 1 (a part corresponding to the drive transistor 3B and the storage capacitor 3C in FIG. 2). The TFT substrate 1 is obtained by, for example, forming a TFT 20 constructing the drive transistor 3B and a capacitor 30 constructing the storage capacitor 3C are formed on a substrate 10 made of glass or the like. Although not shown in FIG. 3, the sampling transistor 3A in FIG. 2 is constructed in a manner similar to the TFT 20.

FIGS. 4A and 4B show sectional structures of the TFT 20 and the capacitor 30, respectively, illustrated in FIG. 3. The TFT 20 is, for example, an oxide semiconductor transistor having, on the substrate 10, a gate electrode 21, a gate insulating film 22, an oxide semiconductor layer 23, a channel protection layer 24, and a source-drain electrode 25 in order. The oxide semiconductor is an oxide of zinc, indium, gallium, tin, or a mixture containing any of those elements as a main component, and is known to show superior semiconductor characteristic. FIG. 5 shows a current-voltage characteristic of an oxide semiconductor TFT made of, for example, an oxide of a mixture of zinc, indium and gallium (indium-gallium-zinc oxide, IGZO). The oxide semiconductor expresses electron mobility 10 times to 100 times as high as that of amorphous silicon used as the semiconductor in related art, and also an excellent off characteristic. The resistance ratio of the oxide semiconductor is $\frac{1}{10}$ to $\frac{1}{100}$ of that of amorphous silicon in related art, and the threshold voltage of the oxide semiconductor may be also easily set to be low, for example, 0V or less.

The gate electrode 21 controls electron density in the oxide semiconductor layer 23 by a gate voltage applied to the TFT 20. The gate electrode 21 has, for example, a two-layer structure of a molybdenum (Mo) layer having a thickness of 50 nm and an aluminum (Al) layer or an aluminum alloy layer having a thickness of 400 nm.

The insulating film 22 has, for example, a two-layer structure of a silicon oxide film having a thickness of 200 nm and a silicon nitride film having a thickness of 200 nm.

The oxide semiconductor layer 23 has, for example, a thickness of 50 nm and is made of indium-gallium-zinc oxide (IGZO). In FIG. 3, the oxide semiconductor layer 23 is meshed.

For the channel protection layer 24, preferably, desorption of oxygen from the oxide semiconductor layer 23 is little and supply of donor such as hydrogen is small. For example, the channel protection layer 24 has a thickness of 200 nm and is made by a silicon oxide film. The channel protection layer 24 is not limited to the silicon oxide film but may be made by a silicon oxynitride film, a silicon nitride film, or an aluminum oxide film, or a multi-layer film made of those films.

The source-drain electrode 25 has, for example, a multi-layer structure made of a titanium layer 25A having a thickness of 50 nm, an aluminum layer 25B having a thickness of 90 nm, and a titanium layer 25C having a thickness of 50 nm.

The capacitor 30 has, for example, on the substrate 10, a bottom electrode 31 formed in the same layer as the gate electrode 21, a capacitor insulting film 32 formed in the same layer as the gate insulating film 22, and a top electrode 33 made of oxide semiconductor. Concretely, the top electrode 33 is formed in the same layer as the oxide semiconductor layer 23 in the TFT 20. With the configuration, in the display device, an interlayer short-circuit defect in the capacitor 30 may be reduced.

In a liquid crystal display device of related art, a capacitor is sufficiently smaller than that in an organic EL display device. In many cases, the top electrode in the capacitor is made of ITO (Indium Tin Oxide) in a manner similar to the pixel electrode. The pixel electrode is thin for the reason that high light transmittance is demanded, has low step coverage since it is formed by reactive sputtering, and is not easily melt in a post process since it is made of a stable oxide. Therefore, even if a foreign mater exists in the insulting film in the capacitor, an interlayer short-circuit between the bottom electrode and the top electrode does not easily occur.

Figure 6:
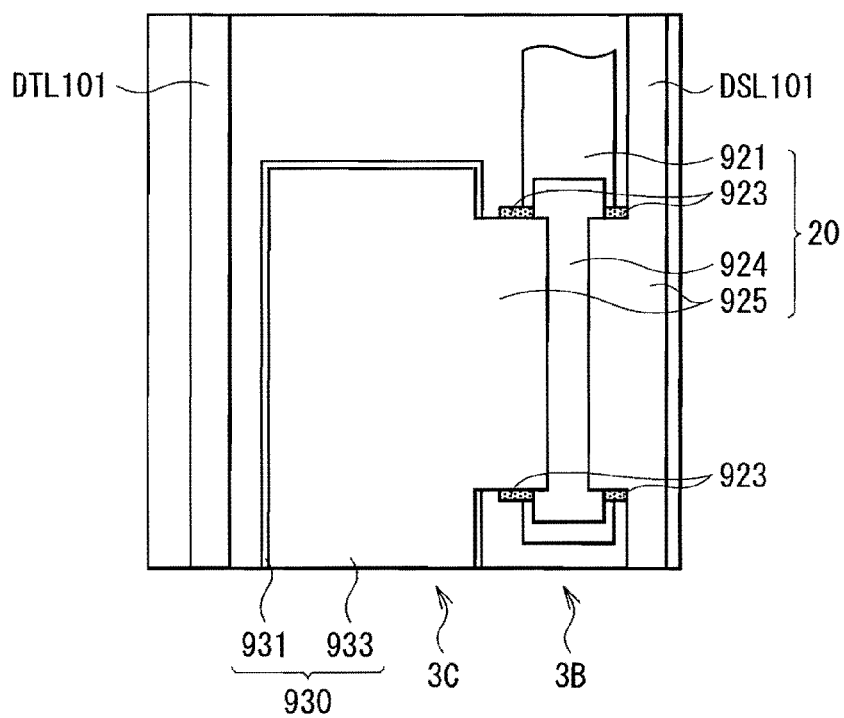
FIG. 6 is a diagram for explaining the influence of a foreign matter on a capacitor in a liquid crystal display device of related art.
Figures 7A, 7B:
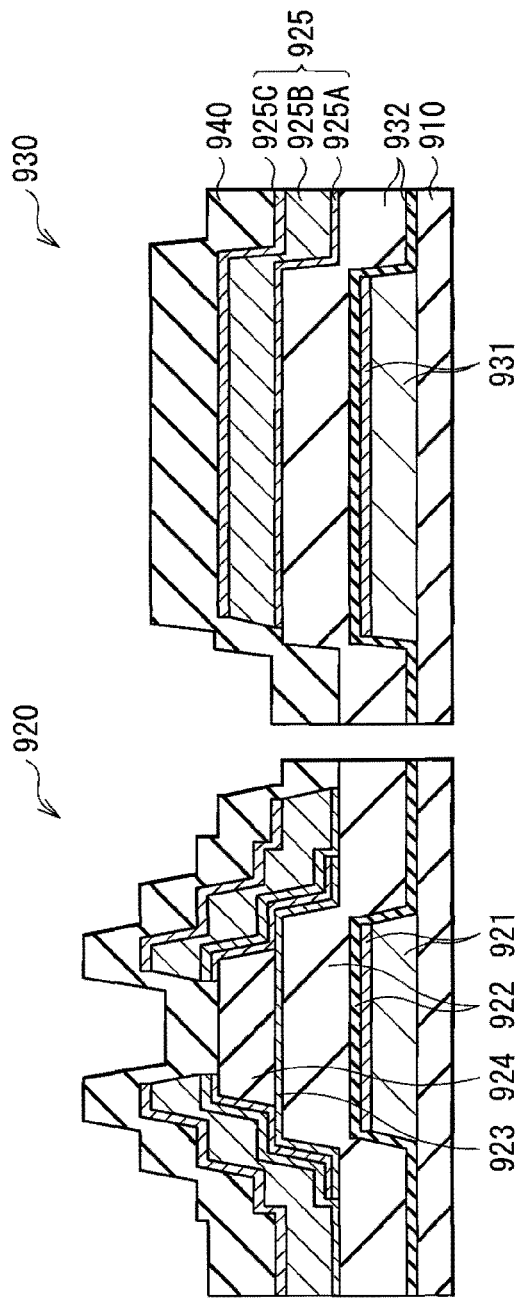
FIG. 7 is a plan view for explaining the configuration of a TFT substrate in an organic EL display device of related art.
Figure 8:
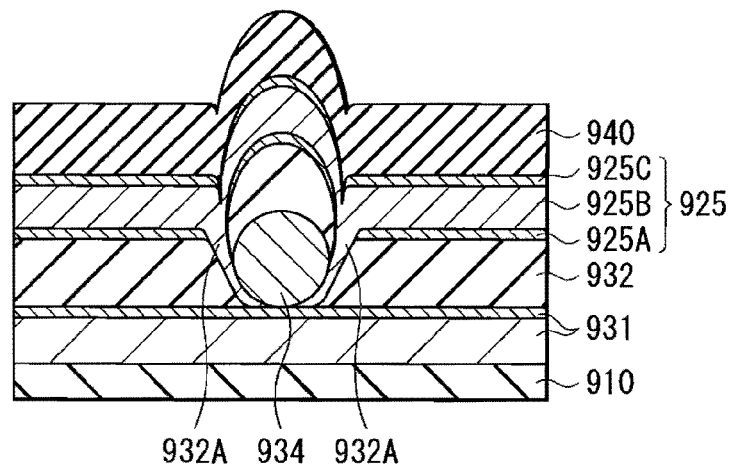
FIG. 8 is a diagram for explaining the influence of a foreign matter on a capacitor shown in FIG. 7.

FIG. 6 shows a plane configuration of a TFT substrate in a organic EL display device of related art. FIG. 7 shows a sectional structure of a TFT and a capacitor illustrated in FIG. 6. In FIGS. 6 and 7, the same reference numerals in the 900s are assigned to components corresponding to those in FIGS. 3 and 4. In the organic EL display device, the size of a capacitor 930 is larger than that in the case of the liquid crystal display device. In the case of a top face light emission (top emission) of letting light generated by an organic light emitting element go from the side opposite to the TFT substrate, the organic light emitting element is formed on a planarization film, so that it is difficult to commonly use the electrode of the organic light emitting element also as a top electrode of the capacitor. Therefore, a top electrode 933 in the capacitor 930 is constructed by a source-drain electrode 925. The source-drain electrode 925 is made of a low-resistance metal and has a large thickness for the reason that heavy current is passed. Consequently, as illustrated in FIG. 8, when a foreign matter 934 exists in an insulating film 932 in the capacitor 930, a conductive material such as a metal or a compound of the metal enters a gap 932A in an insulating film 932 formed near the foreign matter 934, and interlayer short-circuit tends to occur between a bottom electrode 931 and the top electrode 933. To avoid it, it is considered to make only the top electrode 933 in the capacitor 930 of stable ITO with a small thickness. However, extra film forming process and photolithography process may be necessary, and it may increase the cost.

Figure 9:
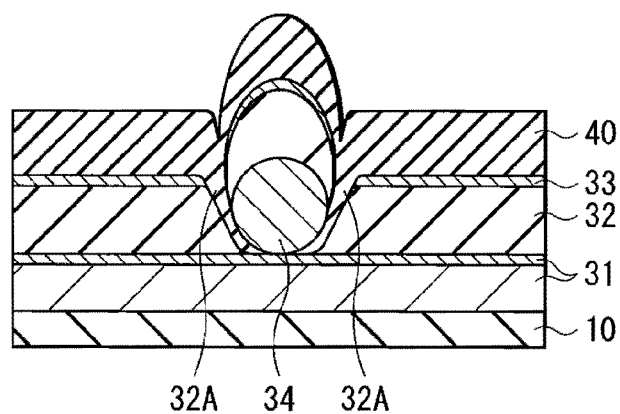
FIG. 9 is a diagram for explaining the influence of a foreign matter on the capacitor shown in FIG. 4.

On the other hand, in the embodiment, the top electrode 33 is formed in the same layer as the oxide semiconductor layer 23 in the TFT 20, so that the top electrode 33 is thin and the step coverage is low. Consequently, as shown in FIG. 9, even if a foreign matter 34 exists in the capacitor insulating film 32, a gap 32A in the capacitor insulating film 32 may not be buried with the top electrode 33 but is buried by a passivation film 40. Therefore, occurrence of interlayer short-circuit between the bottom electrode 31 and the top electrode 33 is suppressed. Since the conductivity of the oxide semiconductor is higher than that of amorphous silicon, a complicated shape such as a comb-teeth shape may not be necessary. The entire surface of the top electrode 33 may be made function as a capacitor electrode.

Figure 4:
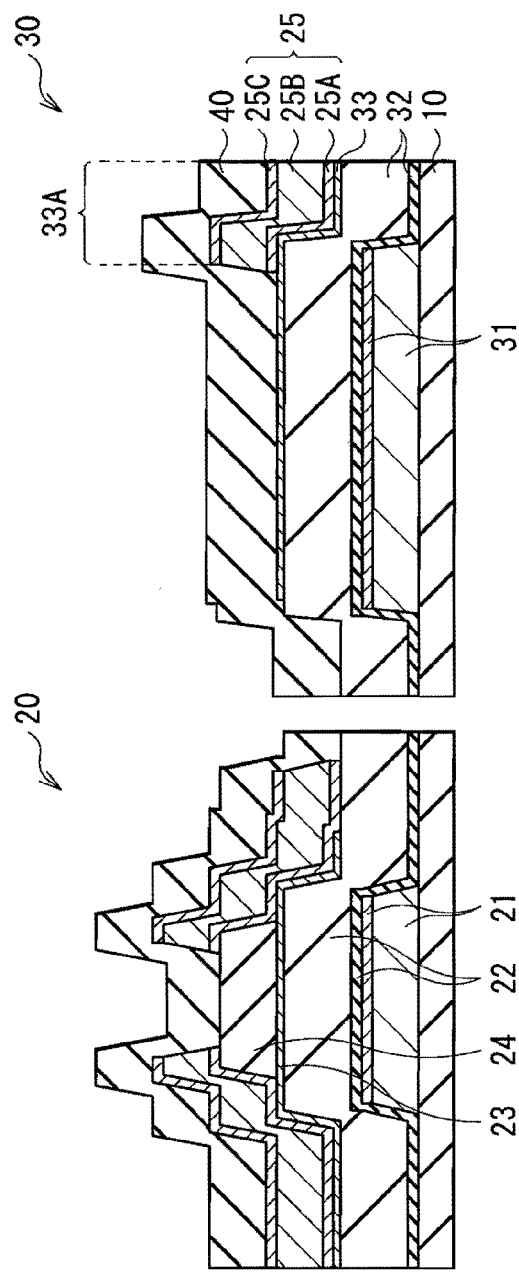
FIGS. 4A and 4B are cross sections showing a configuration of a TFT and a capacitor, respectively, shown in FIG. 3.
Figure 5:
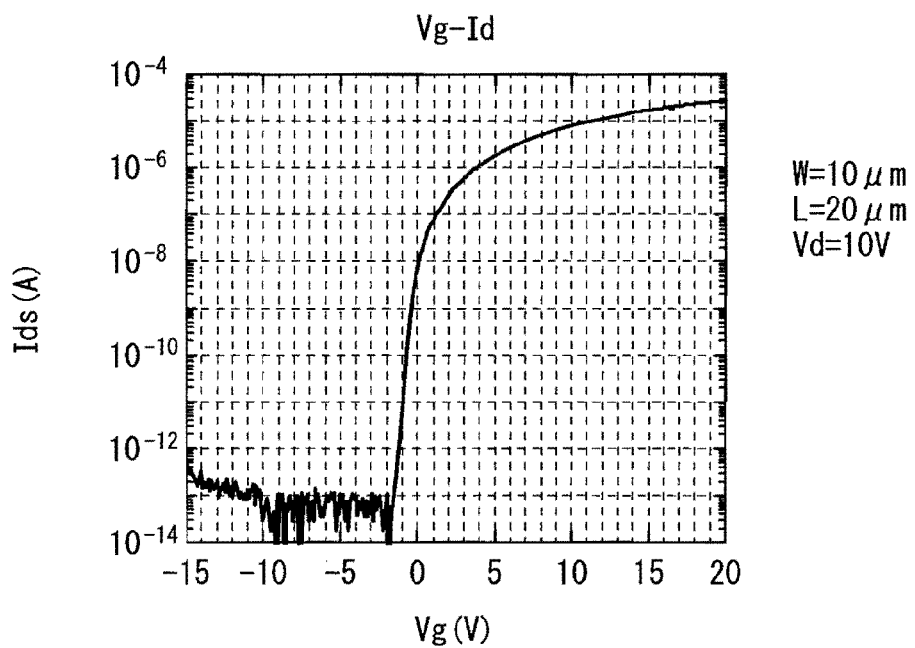
FIG. 5 is a diagram expressing characteristics of a TFT using an oxide semiconductor.

The top electrode 33 shown in FIG. 4 is connected to either the source or drain of the drive transistor 3B as shown in FIG. 2. Specifically, the top electrode 33 has a contact region 33A with the source-drain electrode 25 as a component of the drive transistor 3B. Preferably, in the region other than the contact region 33A in the top electrode 33, the source-drain electrode 25 is not formed. With the configuration, occurrence of interlayer short-circuit caused by a foreign matter existing in the capacitor insulating film 32 may be largely suppressed.

On the other hand, the bottom electrode 31 shown in FIG. 4 is connected to the gate of the drive transistor 3B as shown in FIG. 2. With the configuration, in time to write potential to the capacitor 30 and retention time, the potential applied to the bottom electrode 31 in the capacitor 30 is constantly positive. Therefore, the characteristic of the conductor is constantly maintained for the top electrode 33 made of the oxide semiconductor.

The TFT 20 and the capacitor 30 shown in FIG. 4 are covered with, for example, the common passivation film 40. The passivation film 40 has, for example, a thickness of 200 nm and is a silicon nitride film.

Figure 10:
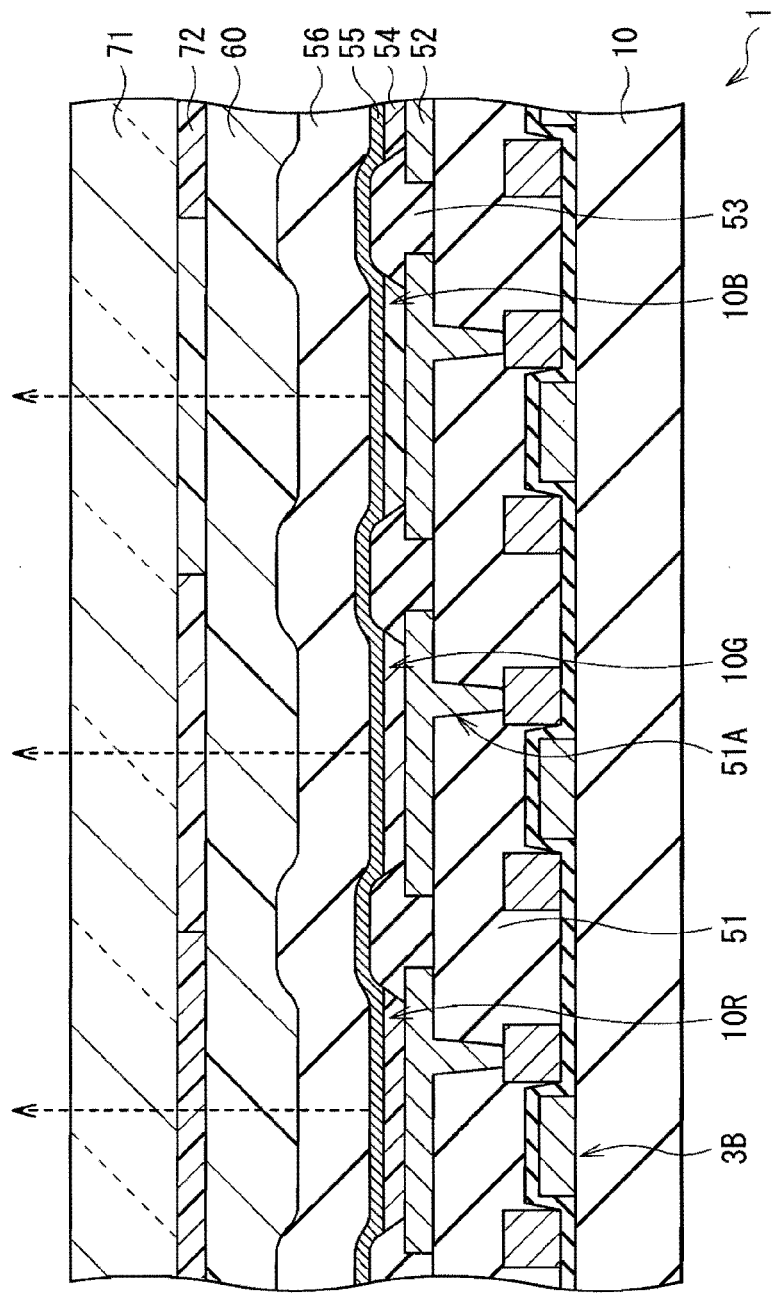
FIG. 10 is a cross section illustrating the configuration of a display region shown in FIG. 1.

FIG. 10 illustrates a sectional configuration of the display region 110. In the display region 110, the organic light emitting elements 10R for emitting light of red, the organic light emitting elements 10G for emitting light of green, and the organic light emitting elements 10B for emitting light of blue are formed in order, generally, in a matrix. Each of the organic light emitting elements 10R, 10G, and 10B has a strip shape in plan view, and a combination of neighboring organic light emitting elements 10R, 10G, and 10B construct a single pixel.

Each of the organic light emitting elements 10R, 10G, and 10B has a configuration in which a planarization insulating film 51, an anode 52, an inter-electrode insulating film 53, an organic layer 54 including a light emitting layer which will be described later, and a cathode 55 are stacked in this order on the TFT substrate 1.

Such organic light emitting elements 10R, 10G, and 10B are covered with a protection film 56 made of silicide nitride (SiN), silicide oxide (SiO), or the like as necessary and are sealed by further adhering a sealing substrate 71 made of glass or the like onto the protection film 55 while sandwiching, between the sealing substrate 71 and the protection film 55, an adhesion layer 60 made of a thermosetting resin, an ultraviolet curing resin, or the like. The sealing substrate 71 may be provided with a color filter 72 and a light shielding film (not shown) as necessary.

The planarization insulating film 51 is provided to planarize the surface of the TFT substrate 1 on which the pixel circuit 140 is formed and is preferably made of a material having high pattern precision for the reason that a small connection hole 51A is formed. Examples of the material of the planarization insulating film 51 include organic materials such as polyimide and inorganic materials such as silicon oxide ($SiO_2$). The drive transistor 3B shown in FIG. 2 is electrically connected to the anode 52 via the connection hole 51A provided in the planarization insulating film 51. Although not shown in FIG. 10, the top electrode 33 of the capacitor 30 as a component of the storage capacitor 3C is also electrically connected to the anode 52 via the connection hole (not shown) provided in the planarization insulating film 51 (refer to FIG. 2).

The anode 52 is formed in correspondence with each of the organic light emitting elements 10R, 10G, and 10B. The anode 52 has the function of a reflection electrode for reflecting light generated by the light emitting layer and, desirably, has reflectance as high as possible from the viewpoint of increasing the luminance efficiency. The anode 52 has a thickness of, for example, 100 nm to 1,000 nm and is made of a metal element or alloy of silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), gold (Au), or the like.

The inter-electrode insulating film 53 is made of, for example, an organic material such as polyimide or an inorganic insulating material such as silicon oxide ($SiO_2$). The inter-electrode insulating film 53 has an opening in correspondence with the light emitting region in the anode 52. The organic layer 54 and the cathode 55 may be provided continuously not only on the light emitting region but also on the inter-electrode insulating film 53. However, light is emitted only in the opening in the inter-electrode insulating film 53.

The organic layer 54 has a configuration in which, for example, a hole injection layer, a hole transport layer, a light emission layer, and an electron transport layer (which are not shown) are stacked in order from the anode 52 side. The layers except for the light emission layer may be provided as necessary. The configuration of the organic layer 54 may vary according to light emission colors of the organic light emitting elements 10R, 10G, and 10B. The hole injection layer is a buffer layer for increasing the hole injection efficiency and for preventing leakage. The hole transport layer is provided to increase the efficiency of transporting holes to the light emission layer. In the light emission layer, when an electric field is applied, recombination of electrons and holes occurs, and the light emission layer generates light. The electron transport layer is provided to increase the efficiency of transporting electrons to the light emission layer. The material of the organic layer 54 may be a common low-molecular or polymer organic material and is not limited.

The cathode 55 has a thickness of, for example, 5 nm to 50 nm and is made of a metal element or an alloy of aluminum (Al), magnesium (Mg), calcium (Ca), sodium (Na) or the like. Particularly, an alloy of magnesium and silver (MgAg alloy) or an alloy of aluminum (Al) and lithium (Li) (AlLi alloy) is preferable. The cathode 55 may be made of ITO (indium tin oxide) or IZO (indium zinc oxide).

For example, the display device may be manufactured as follows.

Process of Forming TFT Substrate 1

First, on the substrate 10 made of glass, for example, a two-layer structure of a molybdenum (Mo) layer having a thickness of 50 nm and an aluminum (Al) layer or an aluminum alloy layer having a thickness of 400 nm is formed by, for example, sputtering. By performing photolithography and etching on the two-layer structure, the gate electrode 21 and the bottom electrode 31 of the capacitor 30 are formed as illustrated in FIGS. 11A and 11B.

Subsequently, on the entire surface of the substrate 10, a two-layer structure of a silicon oxide film having a thickness of 200 nm and a silicon nitride film having a thickness of 200 nm is formed by, for example, CVD (Chemical Vapor Deposition). As a result, as shown in FIGS. 12A and 12B, the gate insulating film 22 and the capacitor insulating film 32 are formed.

After that, an indium gallium zinc oxide (IGZO) film having a thickness of 50 nm is formed by, for example, sputtering and shaped in a predetermined shape by photolithography and etching. By the operation, the oxide semiconductor layer 23 and the top electrode 33 of the capacitor 30 are formed.

Since the top electrode 33 is formed in the same layer as the oxide semiconductor layer 23 of the TFT 20, the top electrode 33 is thin and step coverage is poor. The top electrode 33 is stable with respect to water used in a washing process and a chemical such as a resist stripping liquid used in a photolithography process. Therefore, as shown in FIG. 9, even if the foreign matter 34 exists in the capacitor insulating film 32, occurrence of interlayer short-circuit between the bottom electrode 31 and the top electrode 33 is suppressed.

After formation of the oxide semiconductor layer 23 and the top electrode 33, a silicon oxide film is formed with a thickness of 200 nm by, for example, sputtering or CVD (Chemical Vapor Deposition). Before the silicon oxide film is formed, a process of supplying oxygen to the oxide semiconductor layer 23 using, for example, dinitrogen monoxide plasma, oxygen plasma, or the like may be introduced.

In place of the silicon oxide film formed by sputtering or CVD, silicon oxynitride film, a silicon nitride film, or an aluminum oxide film formed by sputtering, an aluminum oxide film formed by atomic layer deposition (ALD), or a stacked film of those films may be formed.

Subsequently, the silicon oxide film is formed in a predetermined shape by photolithography and etching, thereby forming the channel protection layer 24 as shown in FIGS. 14A and 14B. In the process, a contact hole to the gate electrode 21 may be provided in a region where the oxide semiconductor layer 23 does not exist.

Figures 15A, 15B:
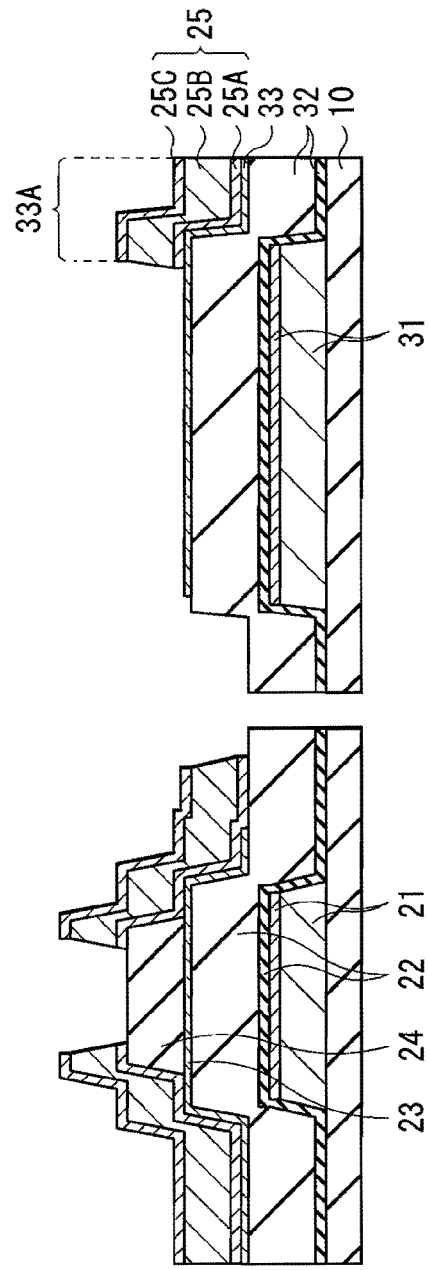
FIGS. 15A and 15B are cross sections illustrating a process subsequent to FIGS. 14A and 14B.

After the channel protection layer is formed, for example, by sputtering, the titanium layer 25A having a thickness of 50 nm, the aluminum layer 25B having a thickness of 900 nm, and the titanium layer 25C having a thickness of 50 nm are formed and shaped in a predetermined shape by photolithography and etching. As a result, as shown in FIGS. 15A and 15B, the source-drain electrode 25 is formed. In this case, the source-drain electrode 25 is extended on the top electrode 33 of the capacitor 30 to form the contact region 33A. Preferably, the source-drain electrode 25 is not formed in the region other than the contact region 33A of the top electrode 33.

After the source-drain electrode 25 is formed, as shown in FIG. 16, the passivation film 40 as the silicon nitride film is formed with a thickness of 200 nm on the TFT 20 and the capacitor 30. In such a manner, the TFT substrate 1 shown in FIGS. 3 and 4 is formed.

Process of Forming Organic Light Emitting Elements 10R, 10G, and 10B

First, a photosensitive resin is applied on the entire surface of the TFT substrate 1, exposed, and developed, thereby forming the planarization insulating film 51 and the connection hole 51A, and they are subjected to baking process. Next, the anode 52 made of the above-described material is formed, for example, by direct current sputtering, selectively etched by using, for example, the lithography technique, and patterned in a predetermined shape. Subsequently, a photosensitive resin is applied to form the inter-electrode insulating film 53 made of the above-described material. For example, using the lithography technique, an opening is formed. After that, for example, by vapor deposition, the organic layer 54 and the cathode 55 made of the above-described materials are sequentially formed to form the organic light emitting elements 10R, 10G, and 10B. Subsequently, the organic light emitting elements 10R, 10G, and 10B are covered with the cathode 55 and the protection film 56 made of the above-described material.

After that, the adhesive layer 60 is formed on the protection film 56. The color filter 72 is provided, the sealing substrate 71 made of the above-described material is prepared, and the TFT substrate 1 and the sealing substrate 71 are adhered with the adhesive layer 60 therebetween. In such a manner, the display device shown in FIG. 10 is completed.

In the display device, according to a control signal supplied from a scan line WSL, the sampling transistor 3A is conducted, and the potential of a video signal supplied from a signal line DTL is sampled and held in the storage capacitor 3C. Current is supplied from a power source line DSL at a first potential to the drive transistor 3B. According to the signal potential held in the storage capacitor 3C, drive current is supplied to the light emitting element 3D (the organic light emitting elements 10R, 10G, and 10B). The light emitting element 3D (the organic light emitting elements 10R, 10G, and 10B) emits light with brightness according to the potential of the video signal by the supplied drive current. The light passes through the cathode 55, the color filter 72, and the sealing substrate 71 and is taken.

Since the top electrode 33 is formed in the same layer as the oxide semiconductor layer 23 in the TFT 20, the top electrode 33 is thin, and step coverage is poor. Therefore, as shown in FIG. 9, an interlayer short-circuit defect caused by the foreign matter 34 in the capacitor insulating film 32 is reduced. Therefore, various display abnormalities caused by the interlayer short-circuit defect are reduced, and the display quality improves.

Since the oxide semiconductor has conductivity higher than that of amorphous silicon, it does not have to be formed in a complicated shape such as a comb teeth shape. The entire surface of the top electrode 33 may function as a capacitor electrode. In particular, since the bottom electrode 31 is connected to the gate of the drive transistor 3B (refer to FIG. 2), in time of writing the potential to the capacitor 30 and the retention time, the potential applied to the bottom electrode 31 in the capacitor 30 is constantly positive potential. Therefore, the top electrode 33 made of the oxide semiconductor constantly maintains the characteristics of conductor.

In the embodiment, since the top electrode 33 in the capacitor 30 is made of the oxide semiconductor, even if a foreign matter exists in the capacitor insulting film 32, occurrence of an interlayer short-circuit defect is suppressed. Therefore, various display abnormalities caused by an interlayer short-circuit defect in the capacitor 30 may be reduced, and high display quality may be realized.

Modification

In the foregoing embodiment, the case has been described such that, as illustrated in FIG. 2, the storage capacitor 3C (capacitor 30) is connected to the gate of the drive transistor 3B, in time of writing the potential to the capacitor 30 and the retention time, positive potential is constantly applied to the bottom electrode 31 in the capacitor 30 and, therefore, the top electrode 33 constantly maintains the characteristics of conductor. Alternatively, for example, in the case where prior to formation of the passivation film 40, for example, a hydrogen plasma process is performed to increase the conductivity of the oxide conductor of the top electrode 33 in the capacitor 30, the top electrode 33 may operate like a conductor regardless of a voltage applied to the capacitor 30.

Figure 17:
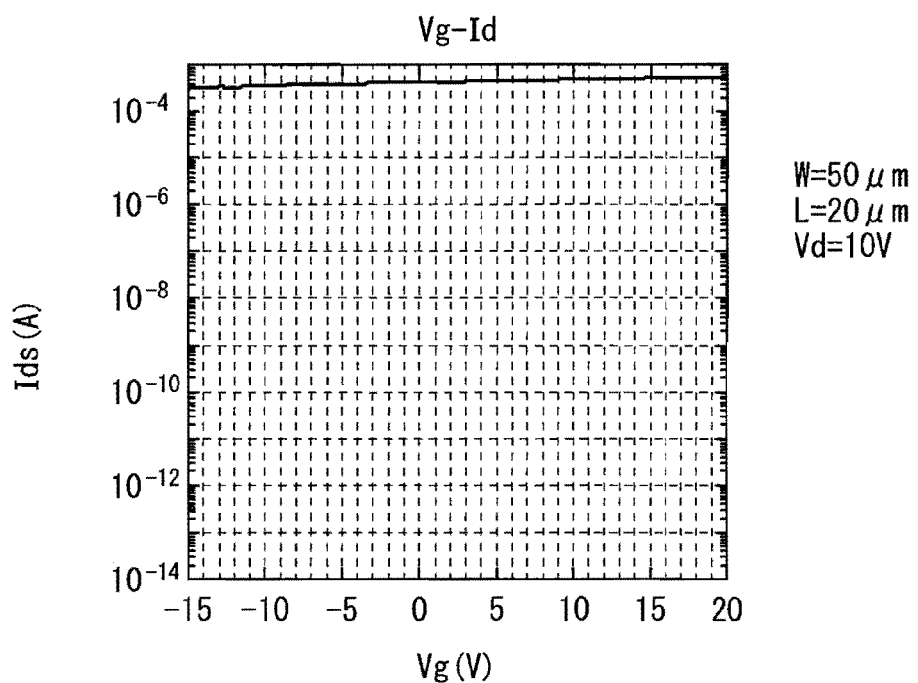
FIG. 17 is a diagram for explaining the influence on the operation of a TFT, of desorption of oxygen of oxide semiconductor.

Specifically, the heat resistance of the oxide semiconductor is not sufficient, so that oxygen is desorbed due to heat treatment, plasma process, and the like in the TFT manufacturing process, and a lattice defect occurs. The lattice defect creates a shallow impurity level in electricity and causes lower resistance of the oxide semiconductor. When the oxide semiconductor is irradiated with the hydrogen plasma, due to introduction of hydrogen as a donor, a level similar to that of the lattice defect is created, and lower resistance of the oxide semiconductor is caused. Consequently, in the case of using the oxide semiconductor for an active layer in the TFT, as defect level increases, threshold voltage decreases, and leak current increase. This is an operation of a depression type that the drain current flows even when the gate current is not applied. When the defect level sufficiently increases, as shown in FIG. 17, the TFT does not perform the transistor operation and shifts to conductor operation.

Therefore, also to the top electrode 33 in the capacitor 30, by performing, for example, the hydrogen plasma prior to formation of the passivation film 40 to increase the conductivity of an oxide semiconductor part exposed in the surface, it is possible to make the top electrode 33 operate like a conductor regardless of the configuration of the pixel circuit 140. Although the hydrogen plasma process is described here, as long as a process increases conductivity of the top electrode 33, a process of making oxygen desorbed or a process of injecting other donors may be performed.

Second Embodiment

Figure 18:
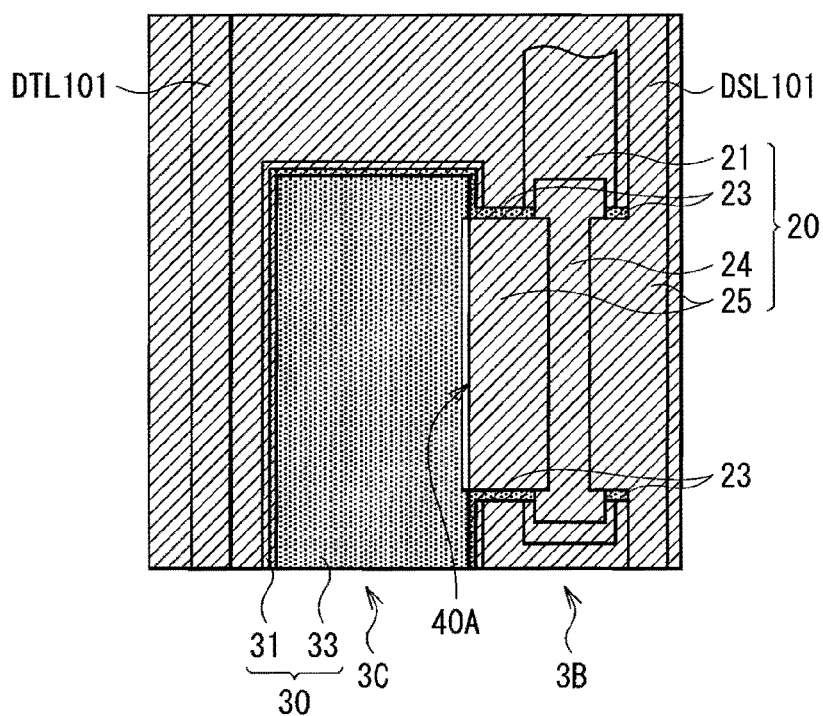
FIG. 18 is a plan view expressing the configuration of a part of a pixel drive circuit of a TFT substrate according to a second embodiment of the invention.
Figures 19A, 19B:
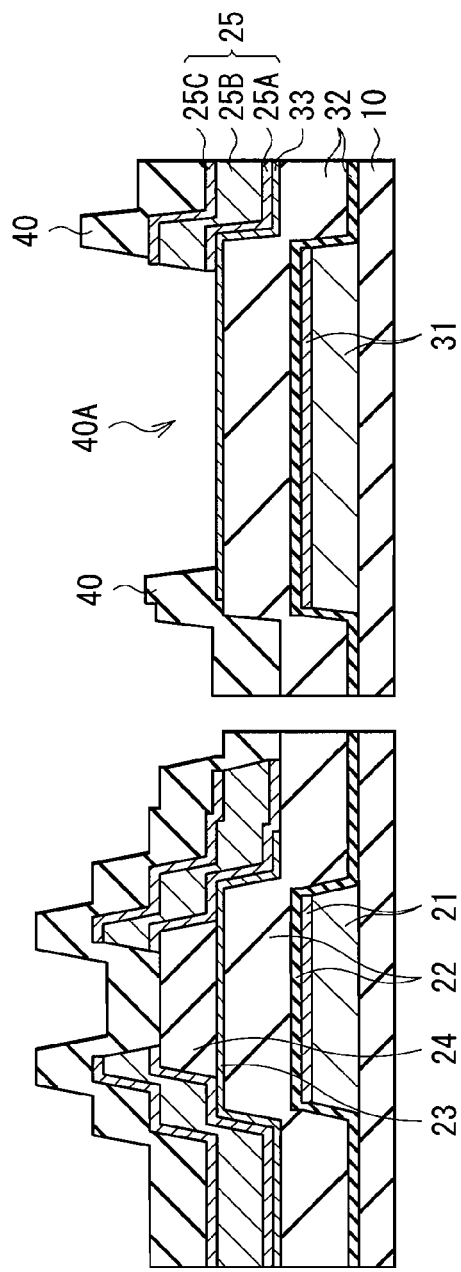
FIGS. 19A and 19B are cross sections illustrating the configuration of the TFT and the capacitor shown in FIG. 18.

FIG. 18 illustrates a plane configuration of a part of the pixel circuit 140 in the TFT substrate 1 according to a second embodiment of the present invention (a part corresponding to the drive transistor 3B and the storage capacitor 3C in FIG. 2). FIGS. 19A and 19B illustrate a sectional structure of the TFT 20 and the capacitor 30 shown in FIG. 18. The second embodiment is similar to the first embodiment except for the configuration of the passivation film 40 covering the TFT 20 and the capacitor 30. Therefore, the same reference numerals are designated to elements corresponding to those of the first embodiment. In FIG. 18, the region in which the passivation film 40 is formed is hatched.

The passivation film 40 has an opening 40A in correspondence with the top electrode 33 in the capacitor 30. With the configuration, in the embodiment, the hydrogen plasma process may be performed only on the top electrode 33 via the opening 40A in the passivation film 40 in the manufacturing process. In the case of a method of performing the hydrogen plasma process prior to formation of the passivation film 40 described in the modification, the conductivity of the source-drain electrode 25, particularly, of a region close to the channel sensitively exerts influence on the TFT characteristic. Consequently, to obtain stable characteristics, there is a task that uniform process has to be performed in the substrate and between the substrates. In the embodiment, however, the stability of the TFT characteristic is assured at the time of forming the passivation film 40. Without deteriorating the characteristic of the TFT 20, the conductivity of the top electrode 33 may be further increased. Therefore, regardless of the configuration of the pixel circuit 140, it is possible to make the top electrode 33 operate like a conductor stably more than the modification.

Figures 20A, 20B:
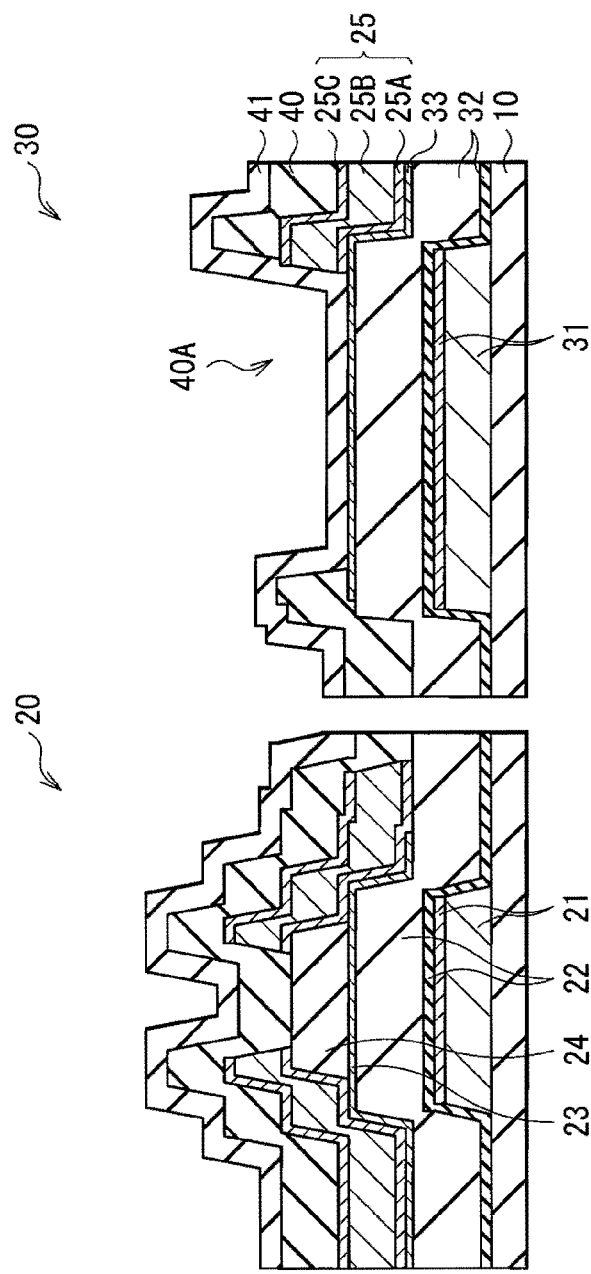
FIGS. 20A and 20B are cross sections illustrating a modification of the TFT and the capacitor shown in FIG. 18.

In the case where the planarization insulating film 51 does not have the function capable of maintaining the conductivity of the top electrode 33 made of the oxide semiconductor exposed in the opening 40A, preferably, a second passivation film 41 is provided at least in the opening 40A in the passivation film 40 as shown in FIGS. 20A and 20B. The second passivation film 41 has, for example, a thickness of 50 nm and is a silicon nitride film. However, when the planarization insulating film 51 has the function capable of maintaining conductivity of the top electrode 33 made of the oxide semiconductor exposed from the opening 40A, the second passivation film 41 may not be provided.

The display device may be manufactured, for example, as follows.

Process of Forming TFT Substrate 1

First, in a manner similar to the first embodiment, by the process illustrated in FIGS. 11A and 11B, the gate electrode 21 and the bottom electrode 31 of the capacitor 30 are formed on the substrate 10 made of glass.

Subsequently, in a manner similar to the first embodiment, by the process illustrated in FIGS. 12A and 12B, on the entire surface of the substrate 10, the gate insulating film 22 and the capacitor insulating film 32 are formed.

In a manner similar to the first embodiment, by the process illustrated in FIGS. 13A and 13B, the oxide semiconductor layer 23 and the top electrode 33 of the capacitor 30 are formed. In a manner similar to the first embodiment, preferably, the top electrode 33 is formed in the same layer as the oxide semiconductor layer 23 of the TFT 20.

After that, in a manner similar to the first embodiment, by the process illustrated in FIGS. 14A and 14B, the channel protection layer 24 is formed.

After formation of the channel protection layer, in a manner similar to the first embodiment, by the process illustrated in FIGS. 15A and 15B, the source-drain electrode 25 is formed. In a manner similar to the first embodiment, preferably, the source-drain electrode 25 is not formed in the region other than the contact region 33A of the top electrode 33.

After the source-drain electrode 25 is formed, in a manner similar to the first embodiment, by the process shown in FIGS. 16A and 16B, the passivation film 40 as the silicon nitride film is formed with a thickness of 200 nm on the TFT 20 and the capacitor 30. Subsequently, as shown in FIGS. 19A and 19B, for example, by etching, the opening 40A is provided, in correspondence with the top electrode 33 in the capacitor 30, in the passivation film 40. To the top electrode 33 exposed from the opening 40A, for example, hydrogen plasma process is performed. With the configuration, hydrogen is not introduced to the oxide semiconductor layer 23 in the TFT 20 so that the characteristics of the TFT 20 do not deteriorate. Further, conductivity of the top electrode 33 is further increased. In such a manner, the TFT substrate 1 illustrated in FIG. 18 and FIGS. 19A and 19B is formed.

In the case of forming the second passivation film 41 as illustrated in FIGS. 20A and 20B, the hydrogen plasma process aiming at increasing the conductivity of the top electrode 33 exposed from the opening 40A is performed. After that, for example, by CVD, the second passivation film 41 is formed on the TFT 20 and the capacitor 30.

Process of Forming Organic Light Emitting Elements 10R, 10G, and 10B

After formation of the TFT substrate 1, a photosensitive resin is applied on the entire surface of the TFT substrate 1, thereby forming the planarization insulating film 51. The planarization insulating film 51 is exposed, developed, and baked. In the case of forming the second passivation film 41, the second passivation film 41 is etched to form the connection hole 51A. Subsequently, for example, by direct current sputtering, the anode 52 made of the above-described material is formed and is selectively etched by using, for example, the lithography technique, and patterned in a predetermined shape. Subsequently, a photosensitive resin is applied to form the inter-electrode insulating film 53. By performing exposure, development, and baking, an opening is formed. After that, the organic layer 54 and the cathode 55 made of the above-described materials are sequentially formed, the organic light emitting elements 10R, 10G, and 10B are formed and, as a result, the display device is formed.

The action and effect of the display device are similar to those of the first embodiment.

MODULES AND APPLICATION EXAMPLES

Hereinbelow, application examples of the display devices explained in the foregoing embodiments will be described. The display devices of the foregoing embodiments may be applied as display devices of electronic devices in all of fields for displaying a video signal entered from the outside or generated internally as an image or a video image, such as a television apparatus, a digital camera, a notebook-sized personal computer, a portable terminal device such as a cellular phone, and a video camera.

Modules

Figure 21:
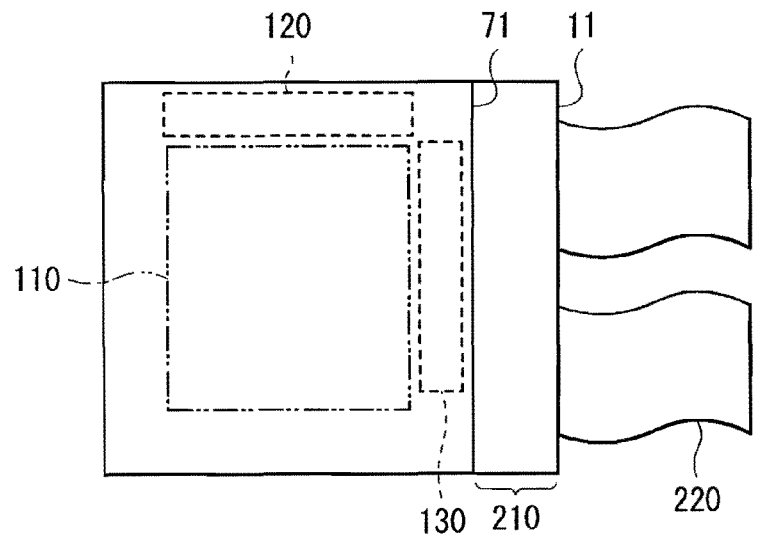
FIG. 21 is a plan view illustrating a schematic configuration of a module including the display device of the foregoing embodiment.

The display device of the embodiments is assembled, for example, as a module shown in FIG. 21, in various electronic devices in application examples 1 to 5 and the like which will be described later. The module has, for example, at one side of a substrate 11, a region 210 exposed from the sealing substrate 71 and the adhesive layer 60. To the region 210, wires of a signal line drive circuit 120 and a scan line drive circuit 130 are extended and external connection terminals (not shown) are formed. The external connection terminal may be provided with a flexible printed circuit (FPC) 220 for inputting/outputting signals.

Application Example 1

Figure 22:
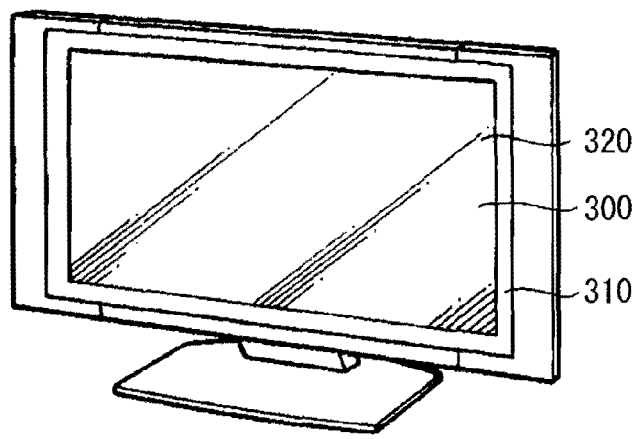
FIG. 22 is a perspective view illustrating the appearance of application example 1 of the display device of the foregoing embodiment.

FIG. 22 illustrates the appearance of a television apparatus to which the display device of the foregoing embodiment is applied. The television apparatus has, for example, a video image display screen 300 including a front panel 310 and a filter glass 320. The video display screen 300 is constructed by the display device according to any of the embodiments.

Application Example 2

Figure 23A:
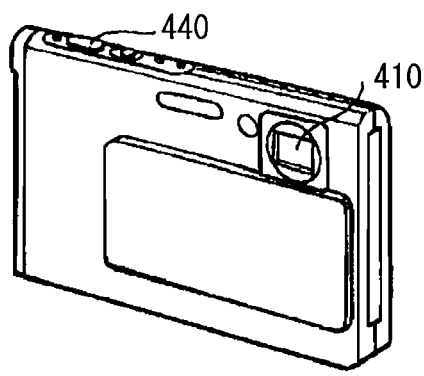
FIG. 23A is a perspective view illustrating the appearance viewed from the surface side of application example 2.
Figure 23B:
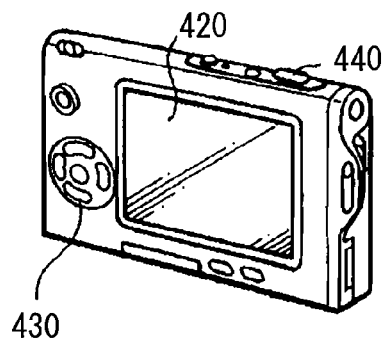
FIG. 23B is a perspective view illustrating the appearance viewed from the back side.

FIGS. 23A and 23B illustrate the appearance of a digital camera to which the display devices of the embodiments are applied. The digital camera has, for example, a light emission unit 410 for flash, a display unit 420, a menu switch 430, and a shutter button 440. The display unit 420 is configured of the display device according to any of the foregoing embodiments.

Application Example 3

Figure 24:
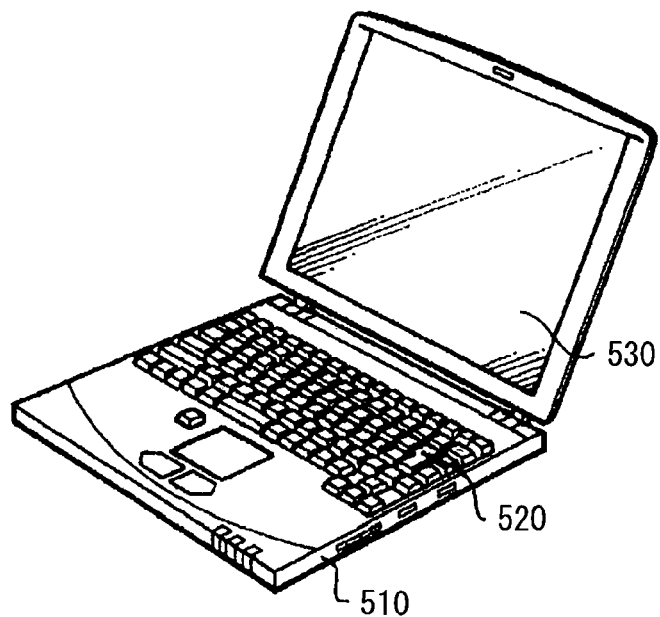
FIG. 24 is a perspective view illustrating the appearance of application example 3.

FIG. 24 expresses the appearance of a notebook-sized personal computer to which the display devices of the foregoing embodiments are applied. The notebook-sized personal computer has, for example, a body 510, a keyboard 520 for operation of entering characters and the like, and a display unit 530 for displaying an image. The display unit 530 is constructed by the display device according to any of the foregoing embodiments.

Application Example 4

Figure 25:
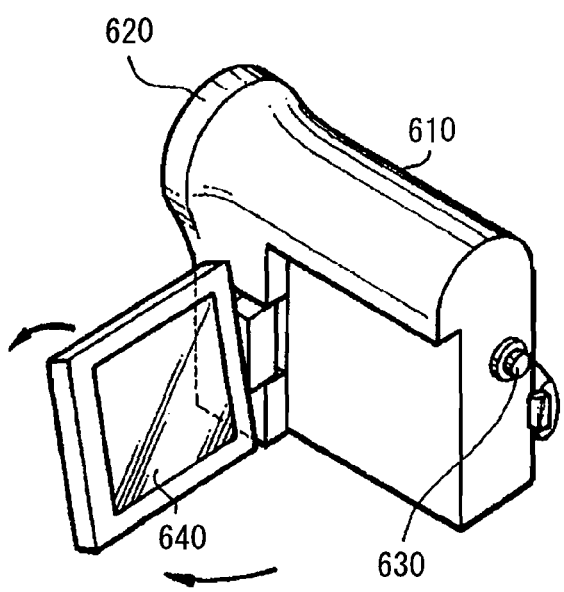
FIG. 25 is a perspective view illustrating the appearance of application example 4.

FIG. 25 illustrates the appearance of a video camera to which the display devices of the embodiments are applied. The video camera has, for example, a body 610, a lens 620 for shooting a subject, provided on the front face of the body 610, a shooting start-stop switch 630, and a display unit 640. The display unit 640 is configured of the display device according to any of the embodiments.

Application Example 5

FIGS. 26A to 26G illustrate the appearance of a cellular phone to which the display devices of the embodiments are applied. The cellular phone is obtained by, for example, coupling an upper-side casing 710 and a lower-side casing 720 via a coupling unit (hinge) 730 and has a display 740, a sub-display 750, a picture light 760, and a camera 770. The display 740 or the sub-display 750 is configured of the display device according to any of the embodiments.

The present invention has been described above by the embodiments. However, the invention is not limited to the embodiments but may be variously modified. For example, in the case where the conductivity of the top electrode 33 in the capacitor 30 is insufficient, it is also effective to lay the wire of the source-drain electrode 25 in a part of the top electrode 33.

In the embodiments, the case where the organic light emitting elements 10R, 10G, and 10B have the configuration that the anode 52, the organic layer 54 including the light emission layer, and the cathode 55 are stacked in this order on the TFT substrate 1 has been described. As long as the organic light emitting elements 10R, 10G, and 10B have the organic layer 54 including the light emission layer between the anode 52 and the cathode 55, the stack order is not limited. For example, the organic light emitting elements 10R, 10G, and 10B may have a configuration in which the cathode 55, the organic layer 54 including the light emission layer, and the anode 52 are stacked in this order on the TFT substrate 1.

Further, in the embodiments, the case where the top electrode 33 in the capacitor 30 is connected to the anode 52 has been described. Depending on the configuration of the pixel circuit 140, the top electrode 33 in the capacitor 30 may be connected to the cathode 55.

For example, the present invention is not limited to the materials and thicknesses of the layers, the film forming methods, film forming conditions, and the like described in the embodiments, but other materials and thicknesses, other film forming methods, and other film forming conditions may be used.

Further, in the foregoing embodiments, the configuration of the organic light emitting elements 10R, 10B, and 10G has been concretely described. All of the layers do not have to be provided, and another layer may be also provided.

In addition, the present invention may be also applied to a display device using, except for the organic light emitting element, another display element such as a liquid crystal display element, an inorganic electroluminescence element, or an electrodeposition or electrochromic display element.

It should be understood by those skilled in the art that various modifications, combinations, sub-combinations and alterations may occur depending on design requirements and other factors insofar as they are within the scope of the appended claims or the equivalents thereof.

What is claimed is:

1. A thin film transistor substrate comprising:
   a substrate;
   a thin film transistor including a gate electrode, a gate insulating film, an oxide semiconductor layer and a source-drain electrode; and
   a capacitor including a bottom electrode, a capacitor insulating film, and a top electrode made of oxide semiconductor in order,
   wherein,
   the top electrode has a contact region which is in contact with the source-drain electrode, and
   the top electrode is thinner than the bottom electrode.

2. A thin film transistor substrate comprising:
   a substrate;
   a thin film transistor including a gate electrode, a gate insulating film, an oxide semiconductor layer and a source-drain electrode; and
   a capacitor including a bottom electrode, a capacitor insulating film, and a top electrode made of oxide semiconductor in order, and a passivation film covering the thin film transistor and the capacitor,
   wherein
   the to electrode is thinner than the bottom electrode.

3. A display device comprising a display element in a thin film transistor substrate, the thin film transistor substrate including:
   a substrate;
   a thin film transistor including a gate electrode, a gate insulating film, an oxide semiconductor layer and a source-drain electrode; and
   a capacitor including a bottom electrode, a capacitor insulating film, and a top electrode made of oxide semiconductor in order,
   wherein,
   the display element is an organic light emitting element having an organic layer including a light emission layer between an anode and a cathode, and
   the to electrode is thinner than the bottom electrode.

4. The display device according to claim 3, wherein the top electrode in the capacitor is connected to one of the anode and the cathode.

5. A display device comprising a display element in a thin film transistor substrate, the thin film transistor substrate including:
   a substrate;
   a thin film transistor including a gate electrode, a gate insulating film, an oxide semiconductor layer and a source-drain electrode;
   a capacitor including a bottom electrode, a capacitor insulating film, and a top electrode made of oxide semiconductor in order; and
   a display region having the display element, and a drive unit,
   wherein,
   the display region includes scan lines, signal lines, and a plurality of pixels made by display elements arranged in matrix, and
   the to electrode is thinner than the bottom electrode.

6. A thin film transistor substrate comprising:
   a substrate;
   a thin film transistor including a gate electrode, a gate insulating film, an oxide semiconductor layer, and a source-drain electrode; and a capacitor including a first electrode, a second electrode made of oxide semiconductor, and a capacitor insulating film between the first electrode and the second electrode, wherein,
    at least one of the first electrode and the second electrode has a contact region which is in contact with the source-drain electrode, and
the second electrode is thinner than the first electrode.

* * * * *